United States Patent
Fillion et al.

(10) Patent No.: US 7,964,974 B2
(45) Date of Patent: Jun. 21, 2011

(54) ELECTRONIC CHIP PACKAGE WITH REDUCED CONTACT PAD PITCH

(75) Inventors: Raymond Albert Fillion, Niskayuna, NY (US); Kevin M. Durocher, Waterford, NY (US); Richard Joseph Saia, Niskayuna, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 222 days.

(21) Appl. No.: 12/326,231

(22) Filed: Dec. 2, 2008

(65) Prior Publication Data

US 2010/0133705 A1 Jun. 3, 2010

(51) Int. Cl.
H01L 23/48 (2006.01)
H01L 23/52 (2006.01)
H01L 29/40 (2006.01)

(52) U.S. Cl. ............. 257/782; 257/690; 257/E23.023; 438/106; 438/612

(58) Field of Classification Search .......... 257/690, 257/782, E23.023, E21.507; 438/106, 612
See application file for complete search history.

(56) References Cited

U.S. PATENT DOCUMENTS

| 5,353,195 | A | 10/1994 | Fillion et al. | |
|---|---|---|---|---|
| 5,946,546 | A | 8/1999 | Fillion et al. | |
| 6,239,482 | B1 | 5/2001 | Fillion et al. | |
| 6,242,282 | B1 | 6/2001 | Fillion et al. | |
| 6,396,153 | B2 | 5/2002 | Fillion et al. | |
| 6,475,877 | B1 | 11/2002 | Saia et al. | |
| 6,905,951 | B2 * | 6/2005 | Yoneda et al. | 438/611 |
| 2005/0224167 | A1 * | 10/2005 | Antesberger et al. | 156/249 |
| 2006/0249754 | A1 * | 11/2006 | Forman et al. | 257/208 |
| 2007/0108549 | A1 * | 5/2007 | Wu | 257/529 |
| 2009/0224391 | A1 * | 9/2009 | Lin et al. | 257/690 |

* cited by examiner

*Primary Examiner* — Phuc T Dang
(74) *Attorney, Agent, or Firm* — Ziolkowski Patent Solutions Group, SC; Jean K. Testa

(57) ABSTRACT

An apparatus and method, the apparatus includes an electronic chip package including an electronic chip having a first and a second contact pad formed thereon, a first dielectric layer coupled to the electronic chip, a second dielectric layer coupled to the first dielectric layer such that a dielectric boundary lies therebetween, a first and a second cover pad positioned along the dielectric boundary, a metal interconnect formed along a first multi-layer via and coupled to the first cover pad and contact pad, and a metal interconnect formed along a second multi-layer via and coupled to the second cover pad and contact pad. The first multi-layer via extends through the second dielectric layer, the first cover pad, and the first dielectric layer to the first contact pad. The second multi-layer via extends through the second dielectric layer, the second cover pad, and the first dielectric layer to the second contact pad.

20 Claims, 5 Drawing Sheets

ELECTRONIC CHIP PACKAGE WITH REDUCED CONTACT PAD PITCH

BACKGROUND

Embodiments of the invention relate generally to electronic chip package connections and, more particularly, to an electronic chip package of an electronic chip with contact pads having a minimized pitch therebetween.

Most semiconductor devices, such as bare chips, have electrical contact pads located on a top-side or active surface of the device to provide input/output (I/O) connections. As more complex devices are designed, the number of contact pads are increased and the pad pitch (i.e., the center-to-center distance between adjacent contact pads) is continually being reduced from 100 microns or so to 50 micron or less. Devices with perimeter pad pitches of 50 microns or so are often difficult to connect to when using an embedded chip interconnect technology. Chips with tighter pad pitches generally cannot be interconnected reliably or repeatedly since shorts often occur between cover pads associated the contact pads.

Embedded chip packaging technologies generally apply a first dielectric layer over a chip top surface, form vias in the dielectric layer such that they abut contact pads on the chip, and then form metal interconnections to the contact pads along the vias and metal cover pads about the via openings on a top surface of the dielectric layer. For yield and reliability issues, the metalized cover pad generally extends beyond the opening of the via. In general, the minimum contact pad pitch that can be accommodated is based upon the sum of the minimum via cover pad length and the minimum pad-to-pad tolerance. For example, a via that has an opening of twenty-five microns at chip surface may be forty microns at the top-side surface, and if the minimum metal feature is ten microns, then the metalized via cover pad diameter may need to be at least equal to the metalized via top-side opening plus twice the minimum metal feature (e.g., sixty microns). To be reliable, two adjacent metal cover pads, each generally centered over a via that is generally centered over the contact pad, should be electrically isolated from each other. As such, a gap or space is often needed between adjacent cover pads, each associated with a contact pad, to avoid shorts. It is generally understood, due to tolerances and variation in metallization, that the gap should be no less than the minimum metal feature size. That is, if the minimum feature size is ten microns, the minimum gap should be no less than ten microns. Accordingly, in the example set forth above, the minimum contact pad pitch should be no less than seventy microns. Such a minimum contact pad pitch places constraints on the design of semiconductor devices and, as technology progresses and the pad pitch of such semiconductor devices is desired to be further decreased to 50 microns or less, such a constraint is highly undesirable.

As such, it may be desirable to have a system that has aspects and features that differ from those that are currently available and that solves at least the aforementioned problems. Further, it may be desirable to have a method that differs from those methods that are currently available.

BRIEF DESCRIPTION OF THE INVENTION

Aspects of the invention provide an electronic chip package including an electronic chip that includes a top surface having a first contact pad and a second contact pad formed thereon so as to be free of an intervening contact pad therebetween, a first dielectric layer coupled to the electronic chip, a second dielectric layer coupled to the first dielectric layer such that a dielectric boundary lies therebetween, a first and a second cover pad at a first and second position, respectively, along the dielectric boundary, a first metal interconnect formed along a first multi-layer via and coupled to the first cover pad and the first contact pad, and a second metal interconnect formed along a second multi-layer via and coupled to the second cover pad and the second contact pad. The first multi-layer via extends through the second dielectric layer, the first cover pad, and the first dielectric layer to the first contact pad. The second multi-layer via extends through the second dielectric layer, the second cover pad, and the first dielectric layer to the second contact pad.

Aspects of the invention also provide an apparatus that includes an electronic chip package having an electronic chip with a first contact pad and a second contact pad positioned adjacent the first contact pad and a build-up structure positioned on the electronic chip and over the first and second contact pads. The build-up structure includes a first and a second dielectric layer having a dielectric boundary therebetween, a first cover pad having a first cover pad aperture therethrough and positioned along the dielectric boundary, and a second cover pad having a second cover pad aperture therethrough and positioned along the dielectric boundary. The build-up structure has a first and a second multi-layer via therethrough. The first multi-layer via extends through the second dielectric layer, the first cover pad aperture, and the first dielectric layer to the first contact pad. The second multi-layer via extends through the second dielectric layer, the second cover pad aperture, and the first dielectric layer to the second contact pad.

Aspects of the invention also provide a method for minimizing contact pad pitch of an electronic chip package that includes providing an electronic chip having a first and a second contact pad thereon and forming a build-up structure on the electronic chip. The build-up structure having a first dielectric layer coupled to a second dielectric layer. Forming the build-up structure includes providing a first and a second cover pad to a one of a top surface of the first dielectric layer and a bottom surface to the second dielectric layer, forming a first multi-layered via through the second dielectric layer, the first cover pad, and the first dielectric layer to the first contact pad, and forming a second multi-layered via through the second dielectric layer, the second cover pad, and the first dielectric layer to the second contact pad. The first and second contact pads are free of an intervening contact pad therebetween. Various other features may be apparent from the following detailed description and the drawings.

BRIEF DESCRIPTION OF THE DRAWINGS

The drawings illustrate at least one preferred embodiment presently contemplated for carrying out the invention.

In the drawings:

FIGS. 9-13 schematically show a cross-sectional view of another electronic chip package during development according to an embodiment of the invention.

DETAILED DESCRIPTION

The invention includes embodiments that relate to reduction of pad-to-pad pitch in an electronic chip package and the electronic chip(s) within the package. Embodiments of the invention may be implemented in electronic chip packages fabricated using a wide variety of fabrication technologies. For example, embodiments of the invention may be implemented in electronic chip packages fabricated using build-up technologies such as embedded chip or flip-chip technologies.

Figure 1:
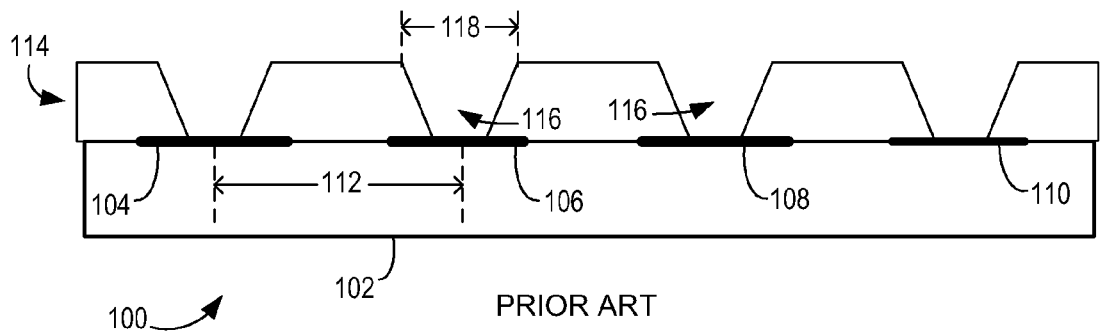
FIGS. 1-2 schematically show a cross-sectional view of an exemplary prior art partial electronic chip package during development.
Figure 2:
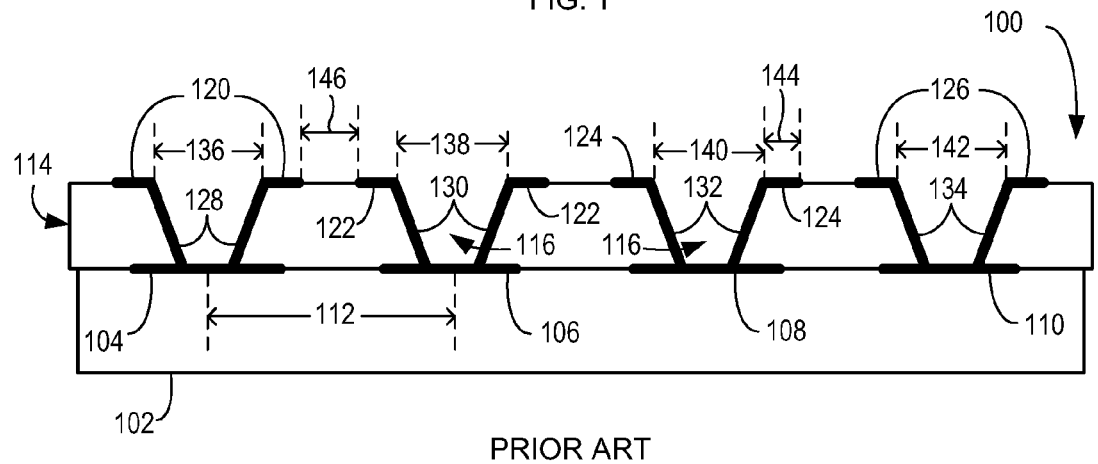

Referring to FIGS. 1 and 2, cross-sectional views of development of an exemplary prior art electronic chip package 100 are schematically shown. As depicted in FIG. 1, an electronic chip 102, a plurality of contact pads 104, 106, 108 110 having a center-to-center distance 112 (i.e., pitch), and a dielectric layer 114 are shown. Formed through dielectric layer 114 is a plurality of single-layer vias 116, each extending to one of contact pads 104-110, and having a top-side opening distance 118. The magnitude of top-side opening distance 118 is dependent on the technique used to form single-layer vias 116.

Proceeding to FIG. 2, after single-layer via 116 formation, a plurality of cover pads 120, 122, 124, 126 are deposited or etched around top-side openings 118 of single-layer vias 116, and a plurality of interconnects 128, 130, 132, 134 are formed or etched onto single-layer vias 116 such that contact pads 104-110 are electrically coupled to cover pads 120-126, respectively. Accordingly, each cover pad 120-126 has a respective cover pad aperture 136, 138, 140, 142 therethrough. Accordingly, electrically conductive paths are created, each extending from contact pads 104-110 to respective cover pads 120-126. Since cover pads 120-126 are formed around top-side openings 118 of single-layer vias 116, the diameter of each cover pad aperture 128-134 is substantially equal to the diameter of each top-side opening 118. In the prior art shown, as is generally known, pitch 112 is often limited by the sum of cover pad aperture 128-134, which is generally equal to the diameter of top-side opening distance 118, a length of cover pad extension 144, and a cover pad to cover pad gap distance 146. That is, as is generally understood, a minimum pitch 112 is often no less than the sum of top-side opening distance 118, a cover pad extension length 144 times a multiple of two, and gap distance 146. Often, if pitch 112 is reduced below such a minimum, one or more of these features (i.e., via opening distance 118, the cover pad extension 114, and/or the cover pad gap distance 146) needs to be reduced. Normal alignment and feature size variations resulting from manufacturing or fabrication tolerances can cause increased defects. As such, reducing feature sizes can also increase defects. For example, if cover pad gap distance 140 is reduced, metal defects can cause adjacent cover pads 120-122, 122-124, 124-126 to touch; thus, resulting in an electrical short during use. Similarly, if the cover pad extension length 144 is reduced, variations can cause mis-alignment of the cover pad 120-126 to via opening 118, resulting in a weak or defective via. Further, if the opening 118 is reduced, via 116 may not completely form to a contact pad such as 104, causing a defective or open electrical connection to electronic chip 102.

Figure 3:
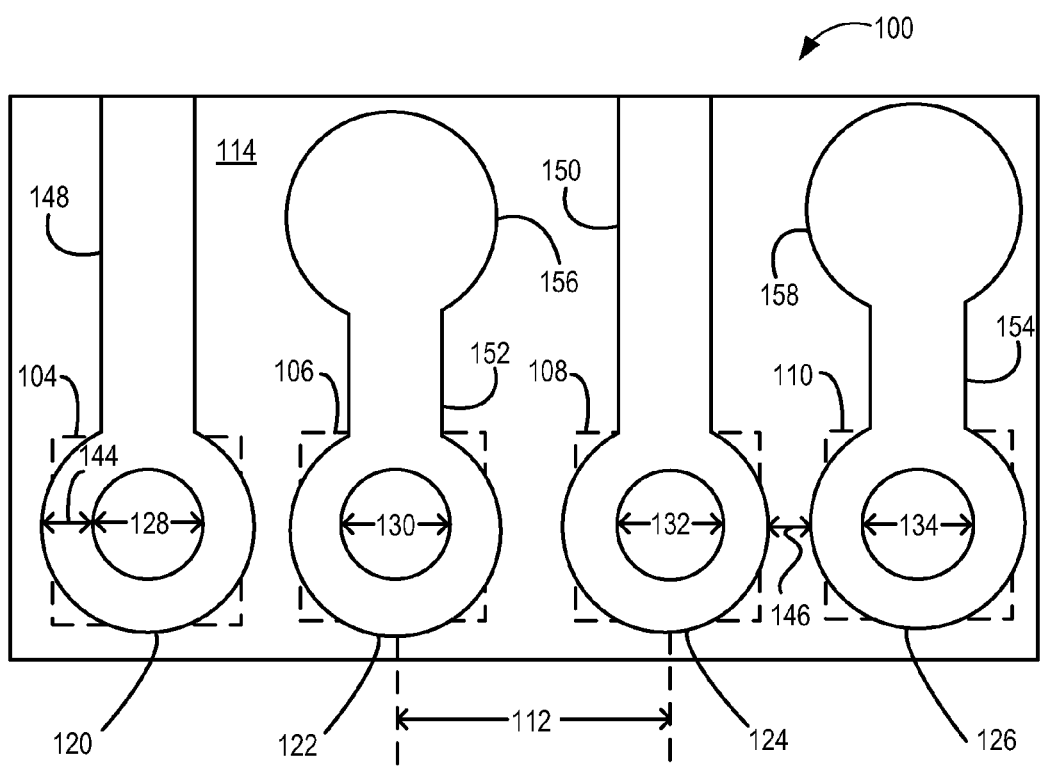
FIG. 3 is a top-side planar view of the exemplary prior art partial electronic chip package of FIG. 2.

Referring to FIG. 3, an exemplary top-side planar view of the prior art electronic chip package 100 of FIG. 2 is depicted, where cover pads 120-126 having respective apertures 128-134 are shown. Coupled to cover pads 120, 124 is a set of routing links 148, 150 respectively extending from cover pads 120, 124 to another area along a top portion of dielectric layer 114 to electrically connect contact pads 104, 108 to another interconnection structure such as a redistributed device pad (not shown), which allows for connection to a layer (not shown) above or below dielectric layer 114. An additional set of routing links 152, 154 respectively connect cover pads 122, 126 to a first layer pad 156, 158, which may form a connection to a layer (not shown) above or below dielectric layer 114. Also shown in FIG. 2 is cover pad extension distance 144, pitch 112, and gap distance 146.

Figure 4:
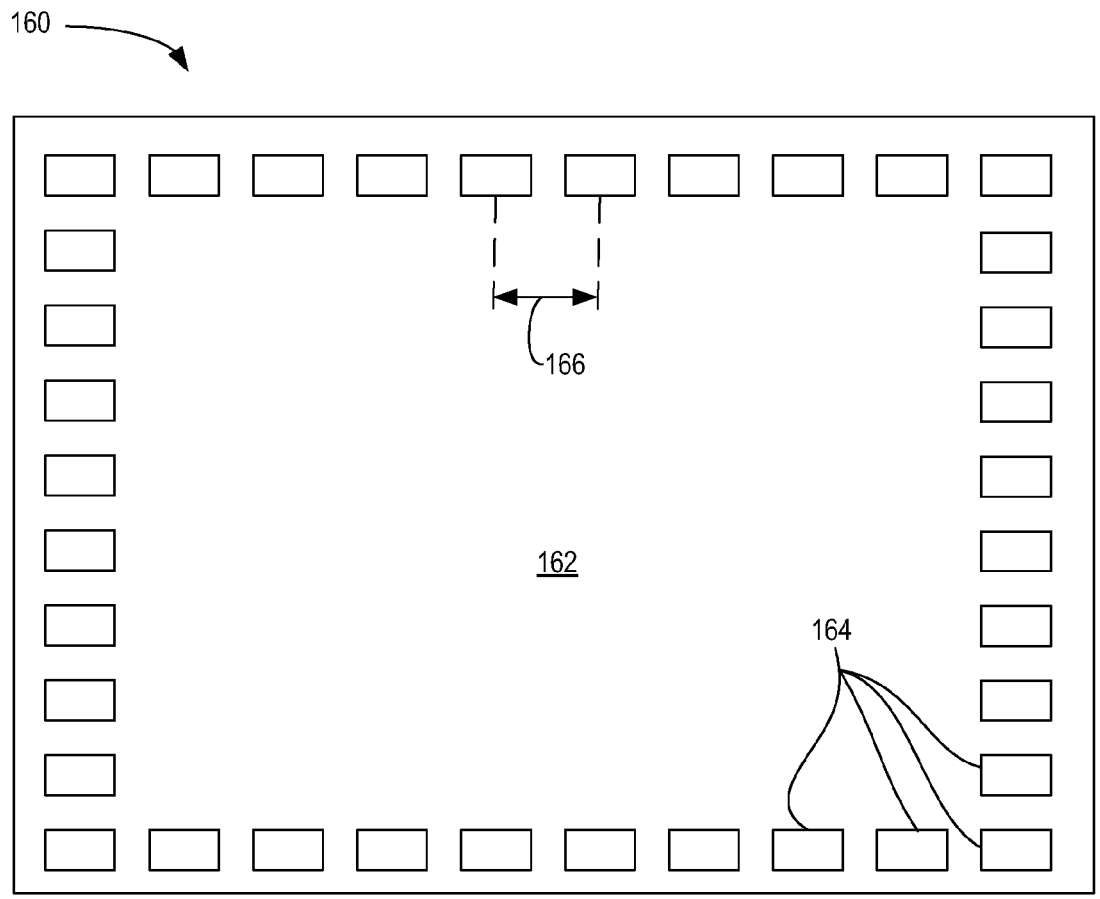
FIG. 4 is a top-side planar view of a bare electronic chip according to an embodiment of the invention.

Referring to FIG. 4, a top-side planar view of a bare or unpackaged electronic chip 160 that may be used with embodiments of the invention is shown. As shown, bare electronic chip 160 includes a substrate 162 and a plurality of contact pads 164 thereon. Contact pads 164 may be placed on substrate 162 by a variety of techniques. For example, a metallization process or the like may be implemented to deposit contact pads 164 onto substrate 162. Alternative techniques such as etching or photolithography may also be implemented. Contact pads 164 may have a composition that includes a variety of materials such as, for example, aluminum, copper, gold, silver, and nickel, or combinations thereof.

As shown in FIG. 4, contact pads 164 are arranged such that they are spaced relative to one another. As such, each consecutive contact pad 164 has a pitch 166 therebetween. Details regarding the minimization of pitch 166 according to embodiments of the invention will be set forth below with respect to FIGS. 5-13.

Embodiments of the invention may use bare electronic chips having their contact pads arranged in a manner different than that shown in FIG. 4. For example, other bare electronic chips may have multiple perimeter rows of contact pads, rather than the single rows of contact pads 164 shown in FIG. 4. Additionally, semiconductor devices may be used that have arrays of contact pads located on any region of a substrate or one or more rows of contact pads generally arranged over the center region of the substrate. Further embodiments may have contact pads arranged along less than all four side of the perimeter of a substrate. Still further, embodiments of electronic chips may include contact pads arranged such that pitch the spacing between contact pads varies.

Figure 5:
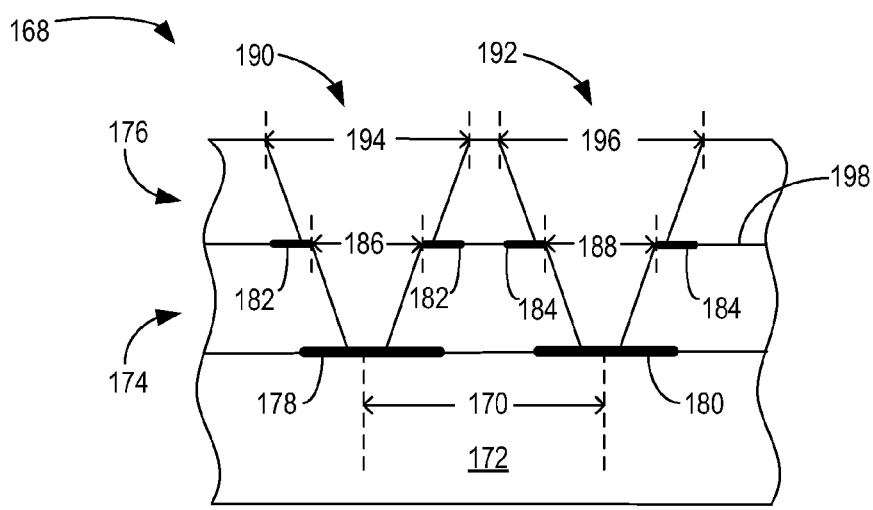
FIG. 5 is a cross-sectional view of a partial electronic chip package according to an embodiment of the invention.

Referring to FIG. 5, a cross-sectional view of a partial electronic chip package 168 having a chip contact pad pitch 170 minimized is shown according to an embodiment of the invention. Electronic chip package 168 includes an electronic chip 172, a first dielectric layer 174, and a second dielectric layer 176. First dielectric layer 174 may be formed of one of several known materials. For example, in one embodiment, first dielectric layer 174 includes a polymer material such as polymide with a thickness ranging from, for example, ten micrometers to one-hundred micrometers. In another embodiment, first dielectric layer 174 is a polymer such as a thermoset coating or a self-bonding film. In yet another embodiment, first dielectric layer 174 is an adhesive to secure second dielectric layer 176 to substrate 172. Still further, first dielectric layer may include two sub-layers, where a polymer film sub-layer acts as the primary dielectric layer and an adhesive sub-layer secures the polymer film sub-layer to electronic chip 172. First dielectric layer 174 may, for example, be deposited by a spin, spray, or an extrusion coating process or may be laminated onto substrate 172 with heat and/or an adhesive. Second dielectric layer 176 may be of a composition similar to, or different than, first dielectric layer 174 and may also be applied in a manner similar to, or different than, that described above with respect to first dielectric layer 174. Though only two dielectric layers 174, 176 are shown in FIG. 5, it is contemplated that embodiments of the invention can include more than two dielectric layers.

Partial electronic chip package 168 also includes a first contact pad 178 and a second contact pad 180 with a first and a second cover pad 182, 184 respectively positioned thereover. Each cover pad 182, 184 has an aperture 186, 188 therethrough. Extending through second dielectric layer 176, first cover pad aperture 186, and first dielectric layer 174 to first contact pad 178 is a first multi-layered via 190. In a similar manner, a second multi-layer 192 extends through second dielectric layer 176, second cover pad aperture 188, and first dielectric 174 to second contact pad 180. As shown, each multi-layered via 190, 192 has a respective top-side opening 194, 196 that differs in size from apertures 186, 188. As will be discussed in greater detail below, cover pads 182, 184 may serve as focusing elements during first and second multi-layer via 190, 192 creation, respectively.

Multi-layered vias 190, 192 may be created using a variety of techniques. For example, in one embodiment, multi-layered vias 190, 192 are created or formed by repeatedly scanning through second and first dielectric layer 176, 174 with a continuous wave laser. Other embodiments include, for example, using photopatterning, a photopatternable polymide, an excimer laser with a mask, other laser ablation techniques, and/or chemical, plasma, or reactive etches to create multi-layered vias 190, 192. Regardless of the technique used to create multi-layered vias 190, 192, each technique will create a via such as multi-layered vias 190, 192 with an associated top-side opening such as top-side openings 194, 196. The diameter of each top-side opening 194, 196, will be dependent on the via forming technique implemented.

By utilizing each cover pad 182, 184 as a masking element for top-side openings 194, 196, the alignment tolerances of top-side opening 194, 196 to the cover pad 182, 184 are eliminated and pitch 170 is minimized. For example, with respect to the prior art of FIG. 1 and an embodiment of FIG. 5, for a given via forming technique, the diameter of each top-side opening 118 of FIG. 1 will be substantially equal to the diameter of each top-side opening 194, 196 of FIG. 5. Accordingly, the diameter of top-side opening 194, 196 is less dependent on the number of layers each multi-layered via 190, 192 is formed through.

In contrast to contact pads 120-126 of the prior art of FIG. 2, cover pads 182, 184 of FIG. 5 are not formed around top-side openings 194, 196 of multi-layered vias 190, 192. Rather, multi-layered vias 190, 192 are formed through apertures 186, 188 of cover pads 182, 184, which are positioned along a boundary 198 between first and second dielectric layers 174, 176. As such, the diameter of each cover pad aperture 186, 188 is not equivalent to the diameter of top-side opening 194, 196, respectively. Due to the position of cover pads 182, 184 along boundary 198, each cover pad 182, 184 serves as a masking element for the ablating techniques used to created multi-layer vias 190, 192. Accordingly, in such an embodiment, since pitch 170 is proportionally related to cover pad aperture 186, 188, rather than top-side opening 194, 196, pitch 170 is minimized. In other words, forming multi-layered vias 190, 192 through cover pads 182, 184 allows for pitch 170 reduction.

Figure 6:
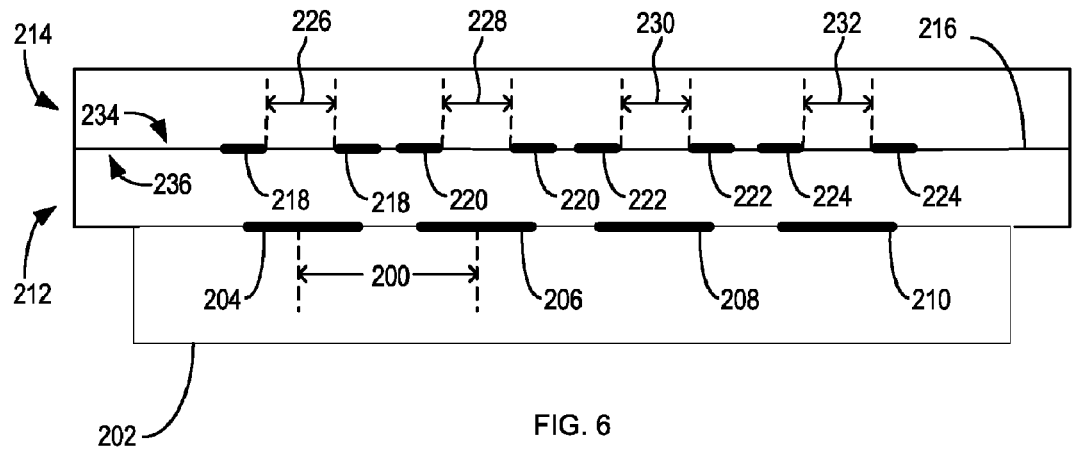
FIGS. 6-9 schematically show a cross-sectional view of an electronic chip package during development according to an embodiment of the invention.

Referring to FIGS. 6-9, development of an electronic chip package having pitch 200 minimized is schematically shown according to an embodiment of the invention. Referring to FIG. 6, an electronic chip 202 having a plurality of contact pads 204, 206, 208, 210 positioned thereon such that pitch 200 is minimized is shown. Coupled to substrate 202 is a first dielectric layer 212 and a second dielectric layer 214. Positioned along a boundary 216 between first and second dielectric layers 212, 214 are a plurality of cover pads 218, 220, 222, 224, each having an aperture 226, 228, 230, 232 respectively therethrough. In one embodiment, cover pads 218-224 are formed or positioned along a top surface 234 of first dielectric layer 212 before second dielectric layer 214 is positioned or formed thereon. In another embodiment, cover pads 218-224 are positioned or formed along a bottom surface 236 of second dielectric layer 214 before second dielectric layer 214 is positioned or adhered to first dielectric layer 212. In such an embodiment, second dielectric layer 214, with cover pads 218-224 thereon, is positioned such that apertures 226-232 are positioned over contact pads 204-210.

A variety of techniques may be used to create first layer cover pads 218-224. For example, first-layer cover pads 218-224 may be created by sputtering or plating techniques followed by standard subtractive patterning using a photoresist etch process. In another embodiment, a semi-additive metal patterning process may be implemented, where a thin seed metal is applied to the first dielectric layer followed by an application of a photoresist on the applied seed metal. The photoresist is then photopatterned to expose selected areas of metal. The exposed areas are then electroplated to the desired thickness, the photoresist is removed, and the exposed seed metal is removed by etching. Other exemplary metallization techniques may include metallization using surface activations.

Figure 7:
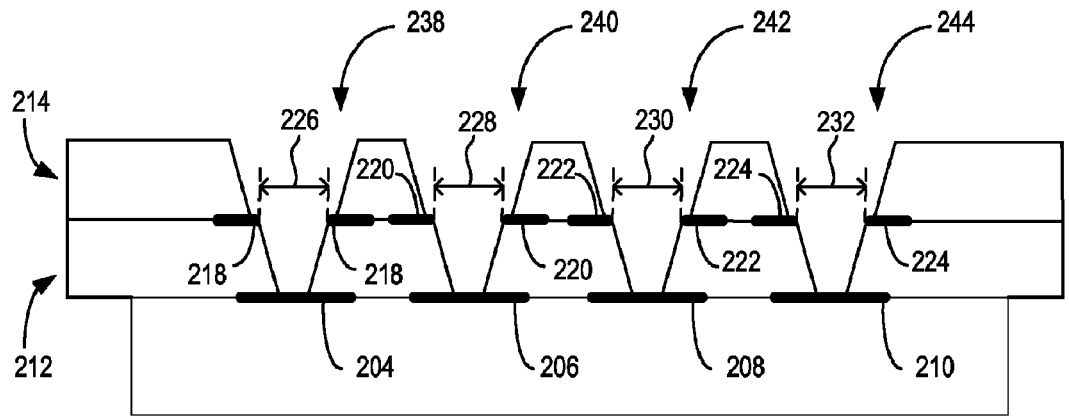

Referring to FIG. 7, a plurality of multi-layered vias 238, 240, 242, 244 extending through second dielectric layer 212, respective apertures 226-232, and first dielectric layer 214 to contact pads 204-210 is shown according to an embodiment of the invention. Multi-layer vias 238-244 can be considered "reach-through" or "shoot-through" vias, since multi-layer vias 238-244 respectively "reach" or "shoot" through cover pads 218-224. A variety of techniques may be used to create multi-layer vias 238-244. For example, in one embodiment, multi-layered via 238-244 are created by repeatedly scanning second and/or first dielectric layers 214, 212, respectively, with a continuous wave laser to create openings (i.e., vias) of desired size and shape extending down to the respective contact pad. Other embodiments include, for example, using photopatterning photopatternable polymides, an excimer laser with a mask, laser ablation techniques, and/or chemical, plasma, or reactive etches to create vias.

Figure 8:
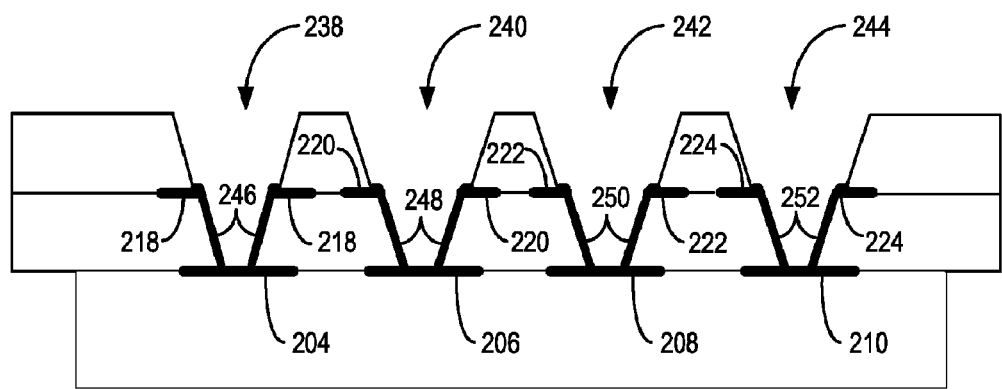

As shown in FIG. 8, after multi-layered vias 238-244 are formed, a metallization technique is implemented to form or create a plurality of single-layer interconnects 246, 248, 250, 252 in or along a portion of each multi-layered via 238-244 to form a plurality of electrically conductive paths. For example, interconnect 246 is coupled to contact pad 204 and cover pad 218 such that an electrically conductive path extending from contact pad 204 to cover pad 218 is formed. In a similar manner, each remaining interconnect 248-252 forms an electrically conductive path from respective contact pad 206-210 to respective cover pad 220-224.

A variety of metals may be used during metallization according to embodiments of the invention. For example, first-layer cover pads 218-224 and single-layer interconnects 246-252 may include an adhesion layer of sputtered copper that is coated by a layer of electroplated copper. Such an embodiment may also include an optional buffered layer of titanium applied over the electroplated copper. In another embodiment, the metallization materials include molybdenum, tungsten, and gold. The metals used during metallization may depend on the materials of the electronic chip, the materials of the contact pads, and on the environment in which the invention will be used. Further, the thickness of the metallization materials used can vary depending on the current requirement of the components of the electronic chip and package.

Figure 9:
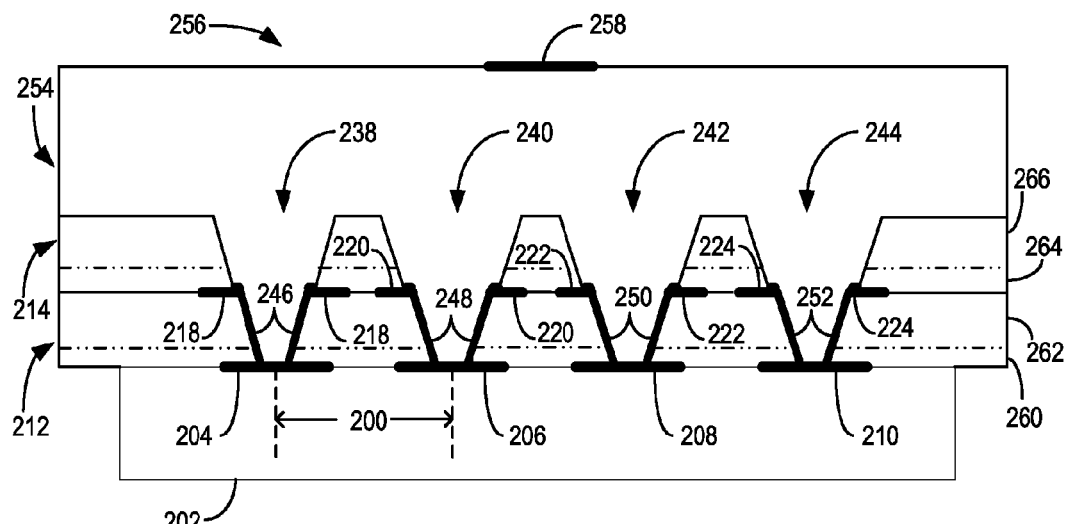

Referring to FIG. 9, in one embodiment, after interconnects 246-252 are formed, a third dielectric layer 254 is coupled to second dielectric layer 214, portions of multi-layer vias 238-244 and any conductive elements (e.g., cover pads 218-224, interconnects 246-252, and any portions of exposed contact pads 204-210) therein. Third dielectric layer 254 may, for example, be a passivation and/or solder mask layer having dielectric properties. Coupled to a top surface 256 of third dielectric layer 254 is an input/output (I/O) pad 258, which may be coupled to another electronic device (not shown). As such, a build-up structure is formed onto electronic chip 202. Though not shown in FIG. 9, it is contemplated that other conductive elements could be positioned along first, second, and/or third dielectric layers 212, 214, 254. Further, it is also contemplated that additional dielectric layers (not shown) could be used in a manner consistent with embodiments of the invention. Since multi-layered vias 238-244 are formed through respective cover pads 218-224 to contact pads 204-210, pitch 200 is minimized.

It is contemplated that one or more of dielectric layers 212, 214, 254 include sub-layers. For example, a plurality of dielectric sub-layers 260, 262, 264, 266 of dielectric layers 212, 214 are shown in phantom in FIG. 9. In one embodiment, first dielectric layer 212 includes two sub-layers 260, 262 and second dielectric layer 214 also includes two sub-layers 264, 266. It is contemplated that third dielectric layer 254 may include sub-layers and that first and/or second dielectric layers 212, 214 may include additional sub-layers without restriction. Further, as discussed above, it is contemplated that a variety of dielectric materials may be used in a manner consistent with embodiments of the invention. For example, dielectric sub-layers 260, 264 may be adhesives that couple dielectric layers 212, 214 respectively, to substrate 202. Further examples of dielectric materials may include, without restriction, barrier coatings, resistive dielectrics, and capacitive dielectrics in the form of films, sheets, or spray-ons.

Though FIGS. 6-9 depict four contact pads 204-210, it is contemplated that only two contact pads (e.g., see FIG. 5), three contact pads, or more than four contact pads may be used in a manner consistent with embodiments of the invention. As such, it is contemplated that other build-up structures or dielectric stacks having configurations different than those shown in FIG. 9 may be used in a manner consistent with embodiments of the invention. That is, substrate 202 may be coupled to other build-up structures or dielectric stacks having multi-layered vias coupled to contact pads in a manner consistent with embodiments of the invention.

Referring now to FIGS. 10-13, development of electronic chip package having pitch 268 minimized is schematically shown according to another embodiment of the invention. As will be discussed in greater detail below, the electronic chip package includes a dielectric stack having a variety of interconnects and vias that are coupled to an electronic chip.

Figure 10:
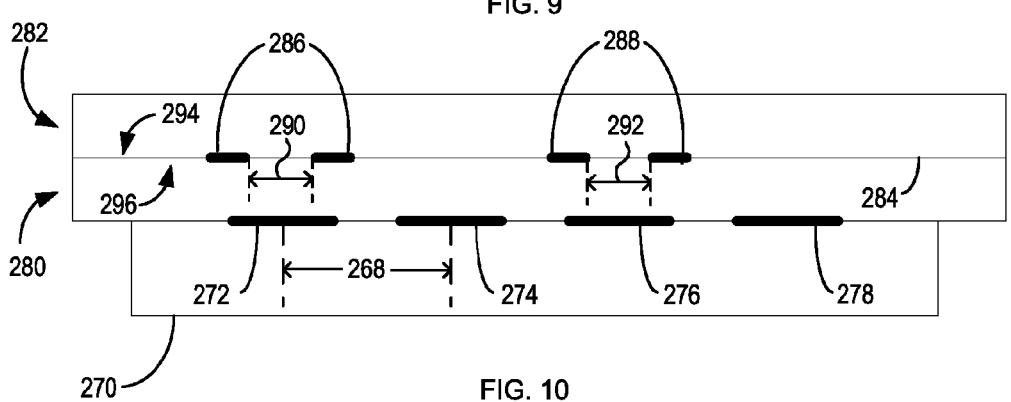

Referring to FIG. 10, an electronic chip 270 having a plurality of contact pads 272, 274, 276, 278 thereon is shown. Also shown is a first and a second dielectric layer 280, 282, respectively, having a boundary 284 therebetween. Along boundary 284 is a set of first-layer cover pads 286, 288 positioned above contact pad 272, 276, respectively. Each cover pad 286, 288 has a cover pad aperture or opening 290, 292. In one embodiment, cover pads 286, 288 are deposited along a top portion 294 of first dielectric layer 280 before second dielectric layer 282 is adhered to first dielectric layer 280. However, it is contemplated that cover pads 286, 288 may be placed along boundary 284 using a variety of other techniques. For example, first-layer cover pads 286, 288 may be adhered to a bottom portion 296 of second dielectric layer 282 before second dielectric layer 282 is adhered to first dielectric layer 280. In such an instance, each cover pad opening 290, 292 is respectively aligned over first and third contact pads 272, 276 as second dielectric layer 282 is applied or adhered to first dielectric layer 280. Additional structures (not shown) may also be positioned along boundary 284 such as a ground or a reference plane and/or passive structures (e.g., inductors, antenna, and couplers).

Figure 11:
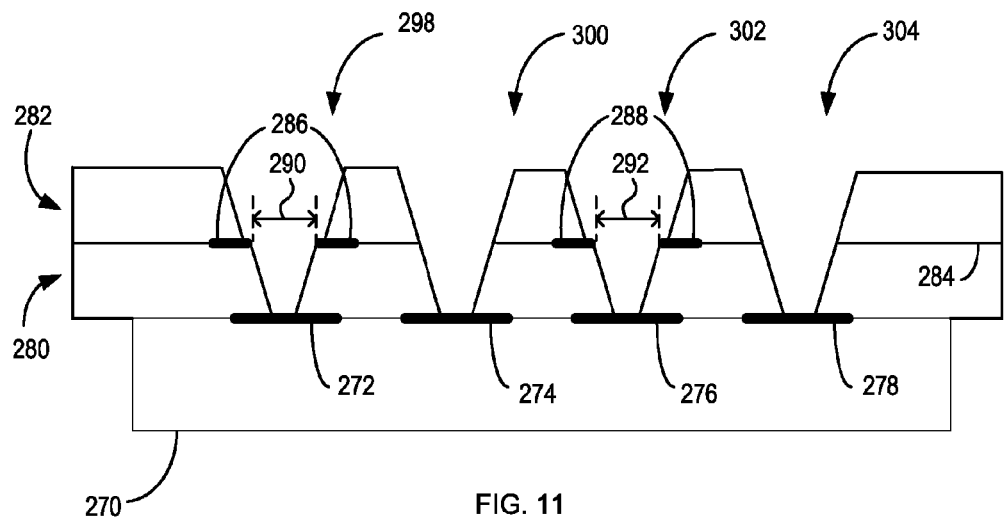

As shown in FIG. 11, after first and second dielectric layers 280, 282 are coupled to substrate 270, a plurality of multi-layered vias 298, 300, 302, 304 are created such that each respectively extends through second and first dielectric layers 282, 280 to respective contact pads 272-278. Multi-layered vias 298, 302 extend through cover pad openings 290, 292 of first-layer cover pads 286, 288 to first and third contact pads 272, 276, respectively. As such, first layer cover pads 286, 288 serve as apertures that determine first-layer via size of multi-layer vias 298, 302.

Figure 12:
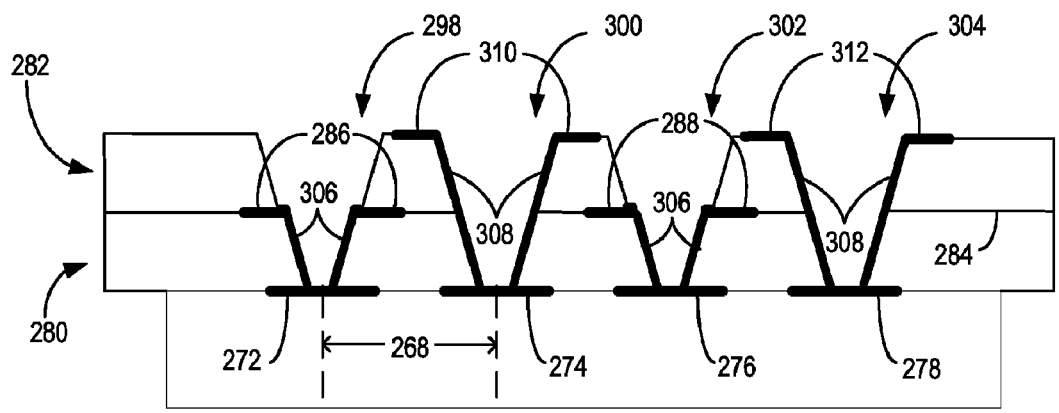

As shown in FIG. 12, after multi-layered vias 298-304 are created, a set of single-layer interconnects 306, a set of dual-layer interconnects 308, and a set of second-layer cover pads 310, 312 are created/applied. As shown, multi-layer interconnects 308 make no contact with conductive components along boundary 284. Again, since multi-tiered contact vias 298-304 were created and since cover pads 286, 310, 288, 312 are staggered in the vertical direction by second dielectric layer 278, pitch 268 (i.e., horizontal spacing) can be minimized. With respect to a transverse vertical plane to FIG. 4, by employing multi-layer vias 298-304 and staggered cover pads 286, 310, 306, 312, portions of second-layer cover pads 310, 312 can respectively overlap portions first-layer cover pads 286, 288. However, it is contemplated that contact pads 272-278 may be spaced such that a gap distance lies between two or more consecutive cover pads 286, 310, 288, 312.

Figure 13:
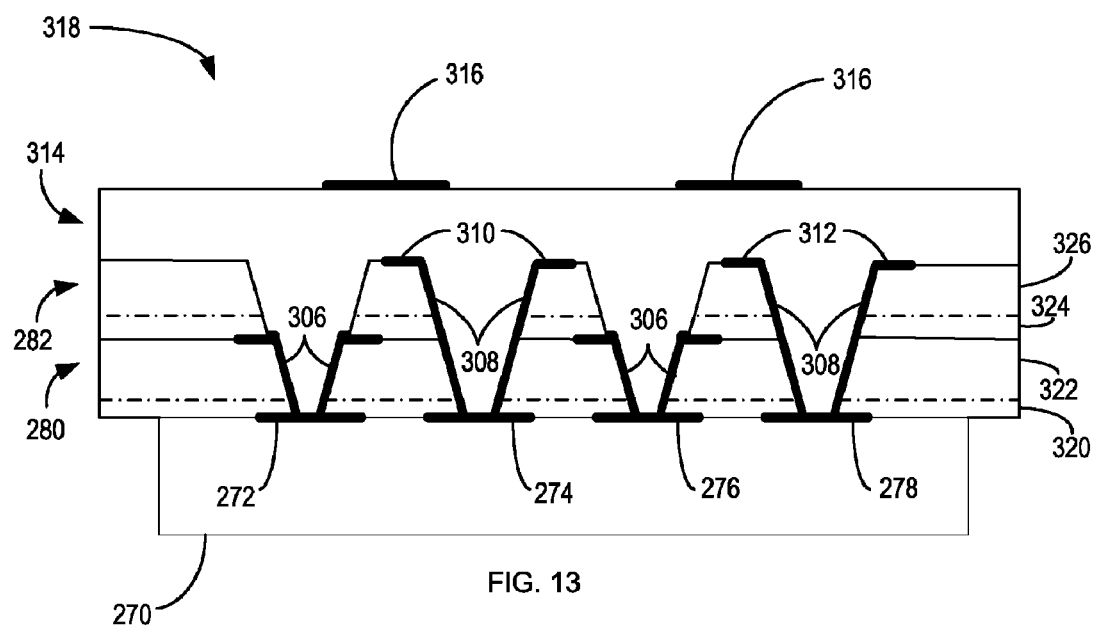

In one embodiment, as shown in FIG. 13, a third dielectric layer 314 is coupled to, or adhered over, second dielectric layer 282, interconnects 306, 308, and second layer cover pads 310, 312. A set of top-side or I/O pads 316 are then created on top of third dielectric layer 314; thus, completing an electronic chip package 318. It is contemplated that top-side pads 316 may be electrically coupled (not shown) to one or more of contact pads 272-278. Further, top-side pads 316 may be used to electrically connect electronic chip package 318 to other circuits or chips. It is also contemplated that top-side pads 316 can be located exterior to electronic chip 270. That is, it is contemplated that top-side pads 316 can be located outside the footprint of electronic chip 270.

It is contemplated that one or more of dielectric layers 280, 282, 314 may include sub-layers. For example, a plurality of dielectric sub-layers 320, 322, 324, 326 of dielectric layers 280, 282 are shown in phantom in FIG. 13. In one embodiment, first dielectric layer 280 includes two sub-layers 320, 322 and second dielectric layer 282 also includes two sub-layers 324, 326. It is contemplated that third dielectric layer 314 may include sub-layers and that first and/or second dielectric layers 280, 282 may include additional sub-layers without restriction. Further, as discussed above, it is contemplated that a variety of dielectric materials may be used in a manner consistent with embodiments of the invention. For example, dielectric sub-layers 320, 324 may be adhesives that couple dielectric layers 280 and 282, respectively, to substrate 270. Further examples of dielectric materials may include, without restriction, barrier coatings, resistive dielectrics, and capacitive dielectrics in the form of films, sheets, or spray-ons.

Figure 14:
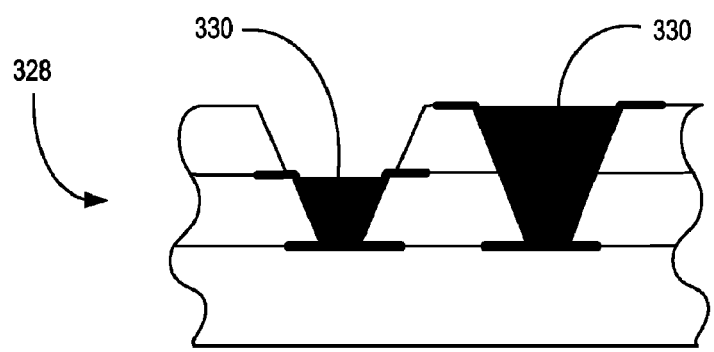
FIG. 14 is a cross-sectional view of a partial electronic chip package having solid post interconnects according to an embodiment of the invention.

Though conformal interconnects 246-252, 306-308 are depicted in FIGS. 8, 9, 12, and 13, other embodiments may implement solid post structures (i.e., post interconnects) that partially or totally fill vias. For example, as shown according to an embodiment in FIG. 14, a portion of an electronic chip package 328 having a set of solid post interconnects 330 is depicted. A variety of metallization techniques may be implemented to create post interconnects 330. Often referred to as solid via plating, such metallization techniques often form a solid metal in vias either by implementing a selective pattern plate-up of the via metal or, through mechanisms of differential etching and plating rates, implement a pulsed plating that alternately plates and etches metal.

According to an embodiment of the invention, an electronic chip package includes an electronic chip with a top surface having a first contact pad and a second contact pad formed thereon so as to be free of an intervening contact pad therebetween, a first dielectric layer coupled to the electronic chip, a second dielectric layer coupled to the first dielectric layer such that a dielectric boundary lies therebetween, a first and a second cover pad at a first and second position, respectively, along the dielectric boundary, a first metal interconnect formed along a first multi-layer via and coupled to the first cover pad and the first contact pad, and a second metal interconnect formed along a second multi-layer via and coupled to the second cover pad and the second contact pad. The first multi-layer via extends through the second dielectric layer, the first cover pad, and the first dielectric layer to the first contact pad. The second multi-layer via extends through the second dielectric layer, the second cover pad, and the first dielectric layer to the second contact pad.

According to another embodiment of the invention, an electronic chip package includes an electronic chip having a first contact pad and a second contact pad positioned adjacent the first contact pad and a build-up structure, the build-up structure positioned on the electronic chip and over the first and second contact pads. The build-up structure includes a first and a second dielectric layer having a dielectric boundary therebetween, a first cover pad having a first cover pad aperture therethrough and positioned along the dielectric boundary, and a second cover pad having a second cover pad aperture therethrough and positioned along the dielectric boundary. The build-up structure has a first and a second multi-layer via therethrough. The first multi-layer via extends through the second dielectric layer, the first cover pad aperture, and the first dielectric layer to the first contact pad. The second multi-layer via extends through the second dielectric layer, the second cover pad aperture, and the first dielectric layer to the second contact pad.

According to yet another embodiment of the invention, a method for minimizing contact pad pitch of an electronic chip package includes providing an electronic chip having a first and a second contact pad thereon and forming a build-up structure on the electronic chip. The build-up structure having a first dielectric layer coupled to a second dielectric layer. Forming the build-up structure includes providing a first and a second cover pad to a one of a top surface of the first dielectric layer and a bottom surface to the second dielectric layer, forming a first multi-layered via through the second dielectric layer, the first cover pad, and the first dielectric layer to the first contact pad, and forming a second multi-layered via through the second dielectric layer, the second cover pad, and the first dielectric layer to the second contact pad. The first and second contact pads are free of an intervening contact pad therebetween.

The invention has been described in terms of the preferred embodiment, and it is recognized that equivalents, alternatives, and modifications, aside from those expressly stated, are possible and within the scope of the appending claims.

What is claimed is:

1. An electronic chip package comprising:
an electronic chip comprising a top surface having a first contact pad and a second contact pad formed thereon so as to be free of an intervening contact pad therebetween;
a first dielectric layer coupled to the electronic chip;
a second dielectric layer coupled to the first dielectric layer such that a dielectric boundary lies therebetween;
a first and a second cover pad at a first and second position, respectively, along the dielectric boundary;
a first metal interconnect formed along a first multi-layer via and coupled to the first cover pad and the first contact pad, the first multi-layer via extending through the second dielectric layer, the first cover pad, and the first dielectric layer to the first contact pad; and
a second metal interconnect formed along a second multi-layer via and coupled to the second cover pad and the second contact pad, the second multi-layer via extending through the second dielectric layer, the second cover pad, and the first dielectric layer to the second contact pad.

2. The electronic chip package of claim 1 wherein the first metal interconnect is a solid post plated interconnect.

3. The electronic chip package of claim 1 wherein the first metal interconnect is a conformal metalized interconnect.

4. The electronic chip package of claim 1 wherein the first dielectric layer comprises a first and a second dielectric sub-layer layer, the first dielectric sub-layer being an adhesive sub-layer.

5. The electronic chip package of claim 1 further comprising a third dielectric layer coupled to the second dielectric layer.

6. The electronic chip package of claim 5 further comprising a plurality of input/output (I/O) pads coupled to a top surface of the third dielectric layer.

7. The electronic chip package of claim 1 wherein the first dielectric layer is one of a barrier coating, a resistive dielectric layer, and a capacitive dielectric layer.

8. The electronic chip package of claim 1 wherein the first and second dielectric layers each comprise sub-layers.

9. The electronic chip package of claim 8 wherein one of the first and second dielectric layers is one of a spray coated dielectric layer, a spin coated dielectric layer, an extrusion coated dielectric layer, and a laminated dielectric layer.

10. An electronic chip package comprising:
an electronic chip having a first contact pad and a second contact pad positioned adjacent the first contact pad; and
a build-up structure positioned on the electronic chip and over the first and second contact pads, the build-up structure comprising:
a first and a second dielectric layer having a dielectric boundary therebetween;
a first cover pad having a first cover pad aperture therethrough and positioned along the dielectric boundary;
a second cover pad having a second cover pad aperture therethrough and positioned along the dielectric boundary; and
wherein the build-up structure has a first and a second multi-layer via therethrough; the first multi-layer via extending through the second dielectric layer, the first cover pad aperture, and the first dielectric layer to the first contact pad; and the second multi-layer via extending through the second dielectric layer, the second cover pad aperture, and the first dielectric layer to the second contact pad.

11. The electronic chip package of claim 10 wherein the build-up structure further comprises a first metal path coupled to the first contact pad, at least a portion of the first multi-layer via, and the first cover pad.

12. The electronic chip package of claim 11 wherein the build-up structure further comprises a second metal path coupled to the second contact pad, at least a portion of the second multi-layer via, and the second cover pad.

13. The electronic chip package of claim 12 further comprising a third dielectric layer coupled to the second dielectric layer.

14. The electronic chip package of claim 10 wherein at least one of the first and the second dielectric layers is a self-bonding film.

15. The electronic chip package of claim 10 wherein the first dielectric layer is one of a spray coated dielectric layer, a spin coated dielectric layer, an extrusion coated dielectric layer, and a laminated dielectric layer.

16. A method for minimizing contact pad pitch of an electronic chip package comprising:
   providing an electronic chip having a first and a second contact pad thereon, wherein the first and second contact pads are free of an intervening contact pad therebetween;
   forming a build-up structure on the electronic chip, the build-up structure having a first dielectric layer coupled to a second dielectric layer, wherein forming the build-up structure comprises:
      providing a first and a second cover pad to a one of a top surface of the first dielectric layer and a bottom surface to the second dielectric layer;
      forming a first multi-layered via through the second dielectric layer, the first cover pad, and the first dielectric layer to the first contact pad; and
      forming a second multi-layered via through the second dielectric layer, the second cover pad, and the first dielectric layer to the second contact pad.

17. The method of claim 16 wherein forming the build-up structure further comprises:
   placing the second dielectric layer having the first and second cover pads provided to the bottom surface onto the first dielectric layer such that a dielectric stack is formed; and
   adhering the electronic chip to the dielectric stack such that the first cover pad is substantially aligned with the first contact pad and the second cover pad is substantially aligned with the second contact pad.

18. The method of claim 16 further comprising solid via plating at least a portion of the first multi-layered via to create a first electrically conductive path that extends from the first contact pad to the first cover pad.

19. The method of claim 16 further comprising:
   conformally metalizing at least a portion of the first multi-layered via to create a first electrically conductive path that extends from the first contact pad to the first cover pad; and
   conformally metalizing at least a portion of the second multi-layered via to create a second electrically conductive path that extends from the second contact pad to the second cover pad.

20. The method of claim 16 wherein forming the first multi-layered via comprises:
   ablating the second and first dielectric layers with a laser; and
   focusing the laser with the first cover pad through the first dielectric layer.

* * * * *